United States Patent
Fukuhara

[19]

[11] Patent Number: 5,834,781

[45] Date of Patent: Nov. 10, 1998

[54] ELECTRON SOURCE AND ELECTRON BEAM-EMITTING APPARATUS EQUIPPED WITH SAME

[75] Inventor: Satoru Fukuhara, Hitachinaka, Japan

[73] Assignee: Hitachi, Ltd., Tokyo, Japan

[21] Appl. No.: 796,490

[22] Filed: Feb. 6, 1997

[30] Foreign Application Priority Data

Feb. 14, 1996 [JP] Japan ................................. 8-049666

[51] Int. Cl.⁶ ............................................ H01J 37/26
[52] U.S. Cl. ........................................ 250/423 F; 313/336
[58] Field of Search ......................... 250/423 F, 423 R, 250/396 R, 398, 310; 313/336

[56] References Cited

U.S. PATENT DOCUMENTS

| | | | |
|---|---|---|---|
| 4,663,559 | 5/1987 | Christensen | 250/396 R |
| 4,954,711 | 9/1990 | Fink et al. | 250/423 F |
| 5,155,412 | 10/1992 | Chang et al. | 250/396 R |
| 5,191,217 | 3/1993 | Kane et al. | 250/423 F |
| 5,536,944 | 7/1996 | Tsunoda et al. | 250/423 F |
| 5,587,586 | 12/1996 | Kruit | 250/423 F |

*Primary Examiner*—Kiet T. Nguyen
*Attorney, Agent, or Firm*—Kenyon & Kenyon

[57] ABSTRACT

An SE electron source in an apparatus utilizing an electron beam such as an electron microscope or electron beam lithography machine has an electron source structure particularly well suited for an electron gun in which the probe current is varied by the control voltage. The electron source includes a needle whose tip has a cone angle of less than 15 degrees and a radius of curvature of less than 0.5 $\mu$m. In an electron gun using an SE electron source according to the invention, the range of variations in probe current caused by a given variation in control voltage is increased, permitting one extraction voltage setting to suffice and the value of the extraction voltage to decrease. Damage to the needle tip due to electric discharge is prevented adding to the stability of the electron gun.

6 Claims, 3 Drawing Sheets

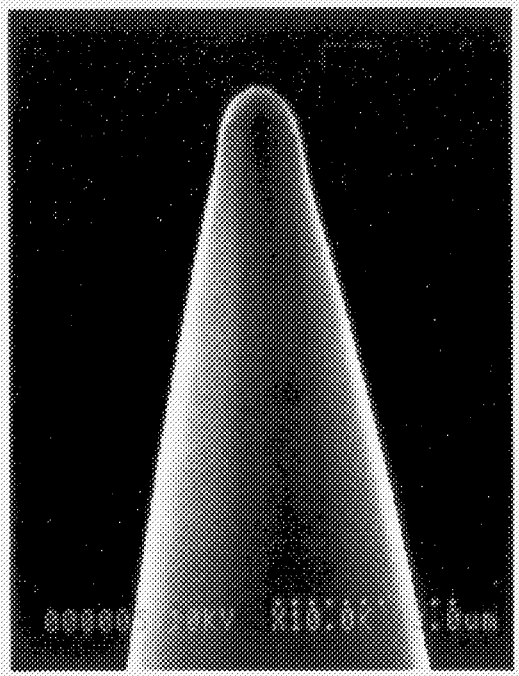
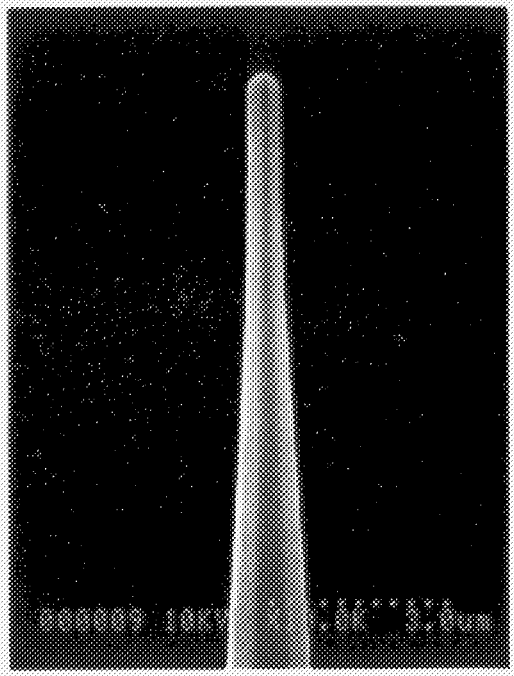
FIG.2A PRIOR ART
FIG.2B

ELECTRON SOURCE AND ELECTRON BEAM-EMITTING APPARATUS EQUIPPED WITH SAME

BACKGROUND OF THE INVENTION

1. Field of the Invention

The present invention relates to an electron source used in practical apparatus using an electron beam such as an electron microscope or electron beam lithography machine.

2. Description of the Prior Art

In recent years, a surface diffusion type electron source has been put into practical use as a new electron source. This source is fabricated by adsorbing monatomic layers of Zr, Ti, Hf, or the like and of oxygen atoms onto the surface of a single-crystal tip of a refractory metal material such as tungsten (W) or molybdenum (Mo). Generally, this new electron source is constructed in the manner described now. A W single-crystal needle having a given crystallographic orientation is joined to the top of a W hairpin filament. The tip of this single-crystal needle is sharpened by electrolytic polishing. A powdered hydrogen compound such as hydrogenated Zr is made to adhere between the W hairpin filament and the single-crystal needle and heat-treated in a vacuum ambient having a partial pressure of oxygen gas to promote diffusion of Zr or the like. In this way, adsorption layers of Zr and O are formed in the given crystallographic crystal plane at the tip of the single crystal (U.S. Pat. No. 4,324,999). Where this electron source is used in a weak field region where no field emission takes place, it is referred to as Schottky emission. Zr/O/W has been put into practical use as this electron source (*J. of Vac. Sci. Technol.* B3 (1), 1985, p. 220)). A control electrode (generally referred to as a suppressor electrode) and an extraction electrode are added to this electron source, thus constituting an electron gun. The fundamental structure of this gun is shown in FIG. 1. Shown in this figure are a single-crystal needle of W (100), indicated by 1, a hairpin filament 2 of polycrystalline W, a terminal 4 of stainless steel or the like to which the filament 2 is spot-welded, and a ceramic insulator 5. An oxide source 3 of Z having a lower work function than the single-crystal needle 1 of W is attached either to the center or base of the single-crystal needle 1 or to the filament 2. This oxide source 3 is heated to about 1500 K to 1900 K to induce thermal diffusion along the single-crystal needle 1 up to its tip. The metal (Zr) oxide diffused to the tip of the single-crystal needle 1 forms a Zr monatomic layer, together with oxygen, at the tip of the single-crystal needle 1. At this time, the layer is preferentially formed by adsorption onto the surface where the surface diffusion has occurred and also onto the certain crystal plane (100) having a higher activation energy. If such a single-crystal needle is used that the (100) crystal plane forms the tip of the single-crystal needle 1, then only the axial end of the single-crystal needle 1 can be left with a low work function. Consequently, a high electron emission current density can be obtained at this location. A suppressor electrode 6 acts to suppress thermoelectrons from the W hairpin filament heated to 1500 K to 1900 K. An extraction electrode 7 serves to cause Schottky emission (hereinafter abbreviated SE) by applying an electric field to the tip of the single crystal. The field intensity applied to the tip by the SE is much lower than in field emission. Accordingly, emitted electrons are thermoelectrons and do not contain tunnel electrons. This means that variations in the emission electron stream intrinsic to field emission electrons do not take place. Hence, a quite stable emission electron stream is obtained. Furthermore, the operating temperature is lower than that of a normal thermionic source such as LaB6 or W hairpin and so the energy spread of the emitted electron stream can be narrowed.

The amount of electron beam emitted from the above-described SE electron source depends on the field intensity at the tip of the needle as described in the above-cited literature. Therefore, it is common practice to adjust the electron beam amount by the extraction voltage applied to the extraction electrode.

However, whenever the extraction electrode is varied, problems such as optical axis misalignment occur.

The gap between the control electrode and the needle tip and the gap between the control electrode and the extraction electrode are quite small, as can be seen from FIG. 1. Therefore, it is desired to reduce the values of voltages applied to these electrodes. However, with the prior art electron gun structure, the electron beam amount can be adjusted only within a narrow range. Furthermore, the voltages applied to the electrodes are high and so electric discharge tends to occur easily. This can cause a damage to the needle tip.

It is an object of the present invention to provide an electron source capable of solving the foregoing problems, as well as an electron beam-emitting apparatus using this electron source.

SUMMARY OF THE INVENTION

In order to achieve the above-described object, the present invention discloses an electron source comprising a needle-like cathode having a tip formed by a cone angle of less than 15 degrees, a control electrode for controlling the amount of electron beam from the cathode, and an extraction electrode for extracting electrons from the needlelike cathode.

The inventive configuration also discloses an electron beam-emitting apparatus which varies the negative voltage value applied to the control voltage while maintaining constant the positive voltage applied to the extraction electrode, thus varying the amount of electron beam.

The tip of the cathode is so shaped that it has a radius of curvature of less than 0.5 $\mu$m.

This construction is adopted for the following reasons.

The optical axis is varied to a lesser extent and greater advantages are obtained by adjusting the control voltage applied to the control electrode than by adjusting the electron beam amount by means of the extraction voltage. That is, ideally, every used electron beam amount can be adjusted by varying the control voltage under a given extraction voltage setting.

The field intensity at the tip of the SE needle depends on the structure of the electron source itself.

As described in *J. Appl. Phys.*, Vol. 44, No. 5, 1973, two parameters, i.e., cone angle (2$\beta$) and radius of curvature r, affect the field intensity.

FIG. 2 shows SEM images of the tips of two kinds of needles used in the present embodiment. The magnification is 10,000× for both images. FIG. 2(*a*) shows the conventional needle having a cone angle (2$\beta$) of 26 degrees and a radius of curvature (r) of 0.55 $\mu$m. FIG. 2(*b*) is an SEM image of the tip of the novel needle. This has a cone angle (2$\beta$) of 8 degrees and a radius of curvature (r) of 0.30 $\mu$m. According to the above-cited literature, the field intensity can be increased by making both parameters as small as possible. In this way, a large field intensity can be created even under a small extraction voltage,. However, the above-cited literature makes no mention of the effect of the control voltage. Our experiment has revealed that the electric field created by the control voltage applied to the control electrode increases by reducing the two parameters.

Therefore, in the above structure, the variation in the field intensity at the tip of the needle per unit voltage variation can be made larger than heretofore.

The present invention can provide an electron source capable of covering the whole range of usable electron beam amounts at one extraction voltage setting by adjusting the control voltage, as well as an electron beam lithography machine equipped with this electron source.

The current density J emitted from the SE electron source is given by the following equation, in which T is the needle temperature, $\phi$ is the work function, a is a constant, F is the field intensity, and k is a constant.

$$J = 120 T^2 \exp(-(\phi - a\sqrt{F})/kT)(A/cm^2) \quad (1)$$

As can be seen from the above equation, the emission current density depends on the temperature T of the needle, on the work function ø of the emitting surface, and on the field intensity F at the tip of the needle. This field intensity F depends on the cone angle of the tip itself and on the radius of curvature. The field intensity F also depends on the space between the SE needle and the extraction electrode. As shown in FIG. 1, the space between the SE needle and the extraction electrode is quite small and so it is difficult to adjust the space further. Therefore, the range of variations in field intensity at the tip of the needle which are caused when the control voltage is varied in a desired range can be enlarged by carrying out adjustment of the cone angle and of the radius of curvature.

It has been known that emission of an electron beam is facilitated simply by sharpening the tip. The present invention provides a novel combination of a Schottky emission electron source sharpened to less than 15 degrees and a method of controlling the amount of electron beam by means of control voltages applied to the control electrode. This increases the range of probe currents obtained in response to variations in control voltage. As a result, the kinds of the voltages applied to the extraction voltage can be reduced to a minimum.

If a desired voltage adjustment range cannot be obtained within the adjustable range of the control electrode, then it is necessary to secure a desired adjustable range of probe currents by adjusting the extraction voltage. However, where the extraction voltage is varied, other parameters must be adjusted with labor. Also, optical axis misalignment occurs. Where these and other drawbacks are taken into account, the ideal method is to secure a desired probe current range with a single extraction voltage setting. This is based on the premise that the optical axis or the position of the virtual light source is not varied by variations in control electrode.

As described thus far, the range of variations in electron beam amount emitted from the electron source can be increased for a given variation in control voltage, by adjusting the cone angle and radius of curvature and also adjusting the amount of the electron beam by means of the control electrode.

BRIEF DESCRIPTION OF THE DRAWINGS

FIGS. 2(a) and (b) show electron micrograms of cathodes fabricated according to the invention and by the prior art techniques, respectively;

DETAILED DESCRIPTION OF THE PREFERRED EMBODIMENTS

Figure 3:
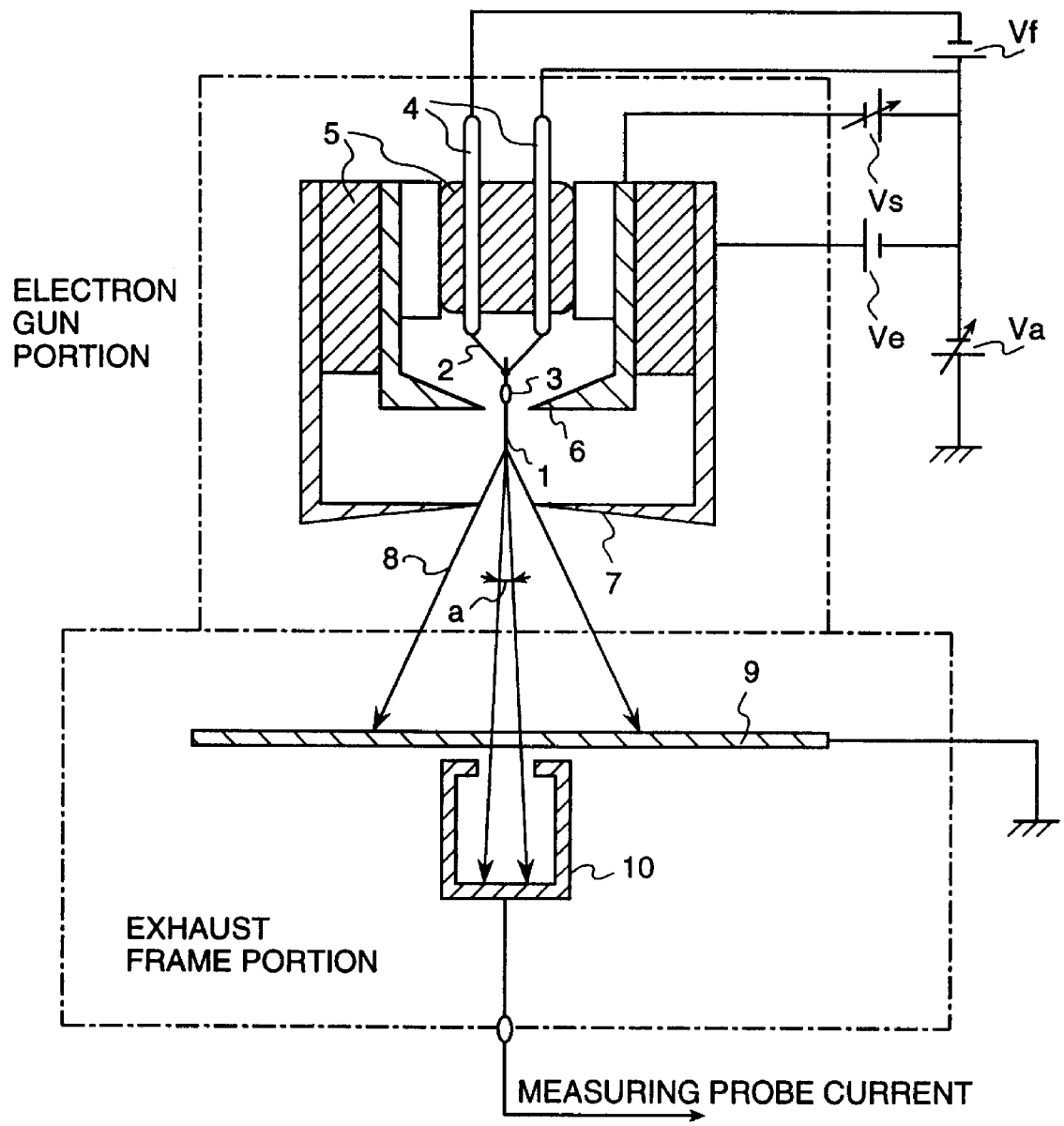
FIG. 3 is a diagram showing a testing machine for novel needle tips and the prior art needle tips.

Embodiments of the present invention are hereinafter described. FIG. 3 is a testing machine evacuated to an ultrahigh vacuum and used to evaluate SE electron guns. It is composed of an electron gun portion and an evacuated frame portion. The machine evaluates the characteristics of numerous guns by replacing the electron gun portion. First, the electron gun portion on which an SE needle is installed is placed on the evacuated frame portion and evacuated to an ultrahigh vacuum. Then, a hairpin filament is electrically energized from a constant current source Vf to heat it. The temperature of the SE needle is maintained at a desired constant temperature between 1600 K and 1800 K.

A positive voltage is applied to the extraction electrode from a high dc voltage source Ve, thus emitting SE electrons from the tip of the SE needle. A negative voltage is applied to the control electrode, or suppressor electrode, from a dc voltage source Vs. This prevents the electrons from leaving the electron path.

As shown, most of the emitted SE electrons reach an aperture plate, while a part arrives at a Faraday cup. At this time, the energy is determined by the high dc voltage source Va. In the case of a length-measuring SEM, a low accelerating voltage of about less than 1 kV is used. The SE electrons incident on the Faraday cup form a probe current, which is actually used in an electron microscope or other instrument utilizing an electron beam. The aperture angle is of the order of several mrad. A current of several pA to several hundreds of pA is obtained. The extraction voltage Ve applied to the extraction electrode is kept constant. The control voltage is varied over a certain range. The resulting probe current is measured.

In this way, the electron beam amount is controlled according to the value of the negative voltage applied to the control voltage. This makes it unnecessary to control the electron beam amount by the extraction voltage. Since the extraction voltage can be fixed, the electron beam amount can be easily set without inducing axial misalignment.

Generally, when the extraction voltage is varied, the ratio of the extraction voltage to the accelerating voltage for accelerating the beam changes. Therefore, the position of the optical axis is varied due to the action of the electrostatic lens. As a result, axial misalignment occurs.

In view of the foregoing, in the present embodiment, the control voltage is varied while maintaining the extraction voltage constant.

In view of the foregoing facts, the above measurements were carried out, using two needle tips having different cone angles and different radii of curvature shown in FIG. 2.

Figure 1:
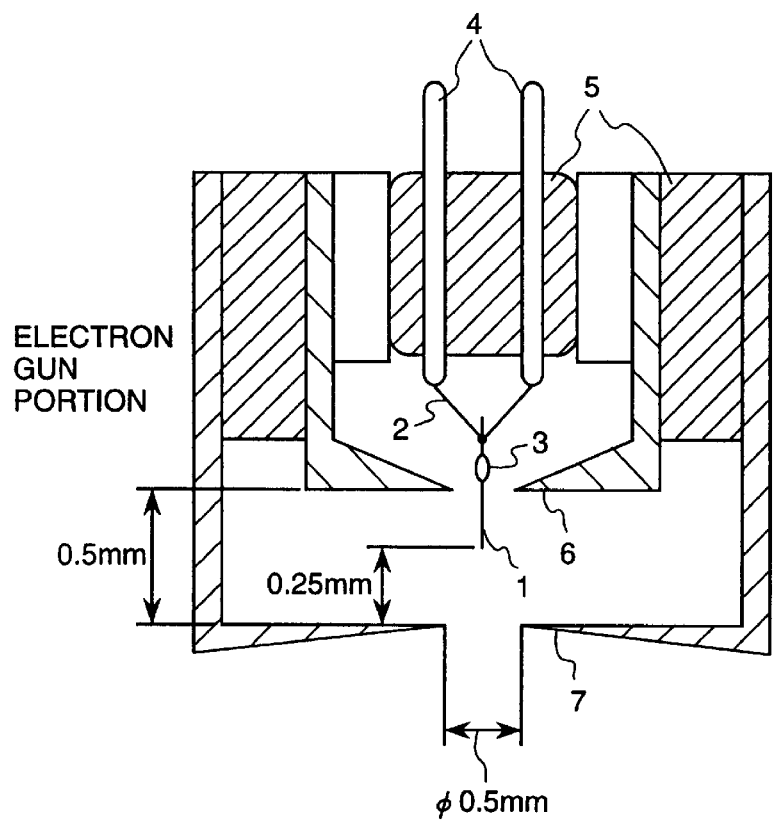
FIG. 1 is a schematic of an SE electron source
Figure 4:
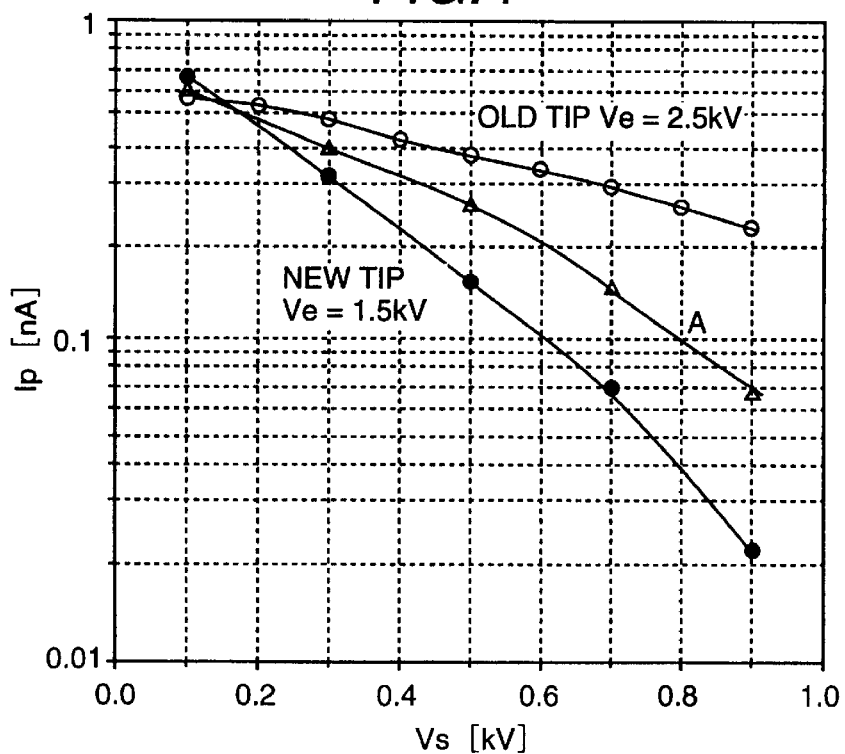
FIG. 4 is a graph comparing the novel needle tips with the prior art needle tips.

The results are shown in FIG. 4. The control voltage was varied over a range from 100 V to 900 V. It can be seen from FIG. 4 that with the prior art, or old, needle tip, the probe current varied from 22 pA to 57 pA and that with the novel, or new, needle tip, the current changed over a quite wide range from 2.3 pA to 67 pA. The extraction voltage Ve was 1.5 kV, which was smaller than in the case of the prior art needle tip.

As described thus far, the extraction voltage can be reduced by adopting the novel electron gun. Furthermore, the range in which the probe current varies in response to a given variation in control voltage increases. In this manner, for a given variation in control electrode, the range of variations of the probe current depends on the cone angle and also on the radius of curvature.

Moreover, among scanning electron microscopes, those instruments which treat semiconductors are required to decrease the probe current in order that they be affected less by charge-up and contamination, for the following reasons. The magnitude of the probe current is in proportion to the frequency of occurrence of charge-up and disturbs the specimen image. Contamination causes a similar undesirable phenomenon. Consequently, a minimum current less than 10 pA is required. We conducted experiments to find this minimum current, and have found that a current beam amount satisfying the above-described conditions is successfully obtained when a needle tip having a cone angle of 15 degrees and a radius of curvature of 0.5 μm is used. Where the cone angle is in excess of 15 degrees (line A of FIG. 4), the minimum current exceeds 10 pA. This does not meet the desired conditions described above.

Accordingly, if the electron source is built at a cone angle less than this, then it is possible to accommodate the probe current range to the above-described conditions. However, a sophisticated technique is required to sharpen the tip. With today's formation technology, the tip can be sharpened only up to 5–6 degrees.

With respect to the radius of curvature of the tip, if it is set larger than 0.5 μm, it is difficult to induce Schottky emission and thus the aforementioned beam current range cannot be obtained. If the radius of curvature is set less than 0.2 μm, field emission makes the beam unstable.

The above embodiment is implemented in an SE electron source. Obviously, similar advantages are derived from an electron gun in which the probe current is varied by a control voltage, in the same way as the foregoing. For example, the invention can be applied to thermal field emission (TFE) electron source, cold field emission (CFE) electron source, and so on, using control electrodes.

Furthermore, the present invention is generally applicable to every apparatus incorporating such an electron source. The invention can be applied with similar utility to scanning electron microscope, transmission electron microscope, electron beam lithography system, and so on.

Experiment has shown that where the electron source described in the illustrated embodiment is applied to an electron beam-emitting apparatus, it is necessary to set the tip of the cathode to less than 15 degrees in order to derive the advantage of the invention that the necessary range of probe currents is obtained with one extraction voltage setting.

With an electron gun using an SE electron source according to the present invention, the obtained range of probe currents increases for a given variation in control voltage. Therefore, the electron beam amount can be set over a wide range with one extraction voltage setting. In consequence, the required range of probe currents can be obtained without varying the extraction voltage. Since the extraction voltage can be retained constant, axial misalignment due to variations of the extraction voltage can be prevented. Additionally, the value of the extraction voltage itself decreases. Therefore, electric discharge is prevented; otherwise the needle would be damaged. This adds to the stability of the electron gun.

What is claimed is:

1. An electron source comprising:

a needlelike cathode;

an extraction electrode extracting electrons emitted from said cathode; and a control electrode disposed between said cathode and said extraction electrode, forming a first electric field which suppresses a second electric field which is formed between said cathode and said extraction electrode, wherein a controllable negative voltage is supplied to said control electrode.

2. An electron source according to claim 1, wherein said cathode has a tip with a radius of curvature of less than 0.5 μm and a tip angle of said tip less than 15 degrees.

3. An electron beam emitting apparatus comprising, a needlelike cathode;

an extraction electrode extracting electrons emitted from said cathode;

a control electrode disposed between said cathode and said extraction electrode; and an adjustable power source supplying a variable negative voltage to said control electrode.

4. An electron beam emitting apparatus according to claim 3, wherein said cathode has a tip with a radius of curvature of less than 0.5 μm and a tip angle of said tip less than 15 degrees.

5. An electron beam emitting apparatus according to claim 3, wherein said control electrode generates a first electrode field which suppresses a second electric field formed between extraction electrode and said cathode.

6. An electron beam emitting apparatus according to claim 3, wherein said extraction electrode is coupled a power source supplying a constant positive voltage.

* * * * *

UNITED STATES PATENT AND TRADEMARK OFFICE
CERTIFICATE OF CORRECTION

PATENT NO. : 5,834,781
DATED : November 10, 1998
INVENTOR(S) : Satoru FUKUHARA

It is certified that error appears in the above-identified patent and that said Letters Patent is hereby corrected as shown below:

ABSTRACT, line 3, after "machine" insert --which--.

Column 1, line 18, change "described now" to --now described.--.

Column 6, line 49, after "coupled" insert --with--.

Signed and Sealed this

Twenty-ninth Day of June, 1999

Attest:

Q. TODD DICKINSON

*Attesting Officer*       *Acting Commissioner of Patents and Trademarks*